(12) United States Patent  (10) Patent No.: US 10,498,131 B2
Graf  (45) Date of Patent: Dec. 3, 2019

(54) ELECTRONIC SWITCH AND PROTECTION CIRCUIT

(71) Applicant: Infineon Technologies AG, Neubiberg (DE)

(72) Inventor: Alfons Graf, Kaufering (DE)

(73) Assignee: Infineon Technologies AG, Neubiberg (DE)

( * ) Notice: Subject to any disclaimer, the term of this patent is extended or adjusted under 35 U.S.C. 154(b) by 404 days.

(21) Appl. No.: 15/395,375

(22) Filed: Dec. 30, 2016

(65) Prior Publication Data

US 2018/0191147 A1    Jul. 5, 2018

(51) Int. Cl.
*H02H 3/08* (2006.01)
*H03K 17/082* (2006.01)

(52) U.S. Cl.
CPC ........... *H02H 3/08* (2013.01); *H03K 17/0822* (2013.01)

(58) Field of Classification Search
USPC ............... 361/93.1–93.3, 93.6–93.9, 94–98
See application file for complete search history.

(56) References Cited

U.S. PATENT DOCUMENTS

| | | | | |
|---|---|---|---|---|
| 5,694,283 A * | 12/1997 | Huczko | ............... | H02H 9/008 361/115 |
| 5,815,027 A | 9/1998 | Tihanyi et al. | | |
| 5,903,422 A * | 5/1999 | Hosokawa | ......... | G01R 19/0092 327/427 |
| 6,130,813 A * | 10/2000 | Kates | ............... | H02H 9/001 307/80 |
| 6,373,677 B1 * | 4/2002 | Ikeda | ............... | F04B 27/1804 361/152 |
| 6,525,918 B1 * | 2/2003 | Alles | ............... | H02H 1/0015 361/87 |
| 7,957,116 B2 * | 6/2011 | So | ............... | G05F 1/573 361/93.1 |
| 8,040,652 B2 * | 10/2011 | Forghani-zadeh | ... | H03K 17/122 361/93.1 |

(Continued)

FOREIGN PATENT DOCUMENTS

| | | |
|---|---|---|
| CN | 104009445 A | 8/2014 |
| DE | 19520735 A1 | 12/1996 |

(Continued)

OTHER PUBLICATIONS

Office Action, in the Chinese language, from counterpart Chinese Application No. 201711474378.5, dated Jan. 28, 2019, 10 pp.

*Primary Examiner* — Ronald W Leja
(74) *Attorney, Agent, or Firm* — Shumaker & Sieffert, P.A.

(57) ABSTRACT

Disclosed is an electronic circuit and a method. The electronic circuit includes a plurality of electronic switches each including a load path and a control node, wherein the load paths are connected in parallel between a first load node and a second load node of the electronic circuit; a current sense circuit configured to sense a load current between the first load node and the second load node and to generate a current sense signal representing the load current; a drive circuit configured to drive the plurality of electronic switches based on at least one input signal; and an overload detector. The overload detector is configured to receive the current sense signal and a select information, and generate an overload signal dependent on the current sense signal and the select information.

27 Claims, 10 Drawing Sheets

(56) References Cited

U.S. PATENT DOCUMENTS

| | | | |
|---|---|---|---|
| 8,611,063 B2* | 12/2013 | So | H02H 9/025 |
| | | | 361/93.9 |
| 9,077,240 B2 | 7/2015 | Cortigiani et al. | |
| 2008/0088290 A1* | 4/2008 | So | G05F 1/573 |
| | | | 323/284 |
| 2011/0273183 A1* | 11/2011 | Shea | H02H 1/0015 |
| | | | 324/536 |
| 2014/0321012 A1* | 10/2014 | Nakayama | H02M 1/088 |
| | | | 361/57 |
| 2015/0016005 A1* | 1/2015 | Simonson | H02H 9/025 |
| | | | 361/93.9 |
| 2016/0164279 A1* | 6/2016 | Asam | H03K 19/018507 |
| | | | 361/87 |
| 2016/0248243 A1* | 8/2016 | Yanagishima | H02H 3/087 |
| 2018/0013294 A1* | 1/2018 | Edelson | H02J 4/00 |
| 2018/0191147 A1* | 7/2018 | Graf | H03K 17/0822 |

FOREIGN PATENT DOCUMENTS

| | | |
|---|---|---|
| DE | 19812920 A1 | 12/1999 |
| DE | 102005009544 A1 | 9/2006 |
| EP | 0747713 A2 | 12/1996 |
| JP | H0746821 A | 2/1995 |
| JP | H08265980 A | 10/1996 |
| JP | 2000299925 A | 10/2000 |
| JP | 2002508542 A | 3/2002 |

* cited by examiner

ELECTRONIC SWITCH AND PROTECTION CIRCUIT

TECHNICAL FIELD

This disclosure in general relates to an electronic switch and protection circuit and, more particularly, to an electronic circuit operable as an electronic switch and an electronic fuse.

BACKGROUND

A fuse is a protection device which trips dependent on a current level of a current and dependent on a time duration during which the current level prevails. A fuse, for example, trips virtually instantaneously if the current is higher than a maximum current, does not trip if the current is a rated current or below, and trips after a delay time that is dependent on the current level if the current is between the rated current and the maximum current. A fuse may be used to protect a load and a cable between a power source and the load. The function of a fuse can be implemented using an electronic switch and a drive circuit.

In a complex system a plurality of electric loads and, therefore, a plurality of fuses may be required. In a car, for example, rated currents of loads implemented in the car may range from several milliamps to several 10 amps. Usually cables between a power source such as the car battery and these loads are chosen based on the rated currents of the individual loads. Consequently, different types of fuses are required in order to protect the different types of cables. This, however complicates the manufacturing and supply process.

There is therefore a need for an electronic circuit that functions as a fuse and can be used for different types of loads and cables.

SUMMARY

One example relates to an electronic circuit. The electronic circuit includes a plurality of electronic switches, a current sense circuit, a drive circuit and an overload detector. Each of the plurality of electronic switches includes a load path and a control node, wherein the load paths are connected in parallel between a first load node and a second load node of the electronic circuit. The current sense circuit is configured to sense a load current between the first load node and the second load node and to generate a current sense signal representing the load current. The drive circuit is configured to drive the plurality of electronic switches based on at least one input signal. The overload detector is configured to receive the current sense signal and a select information, and generate an overload signal dependent on the current sense signal and the select information.

Another example relates to a method. The method includes driving a plurality of electronic switches based on at least one input signal, wherein each of the plurality of electronic switches comprises a load path and a control node, and wherein the load paths are connected in parallel between a first load node and a second load node of the electronic circuit. The method further includes generating a current sense signal based on sensing a load current between the first load node and the second load node, and generating an overload signal dependent on the current sense signal and a select information.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and, by way of illustration, show specific embodiments in which the invention may be practiced. It is to be understood that the features of the various embodiments described herein may be combined with each other unless specifically noted otherwise.

Figure 1:
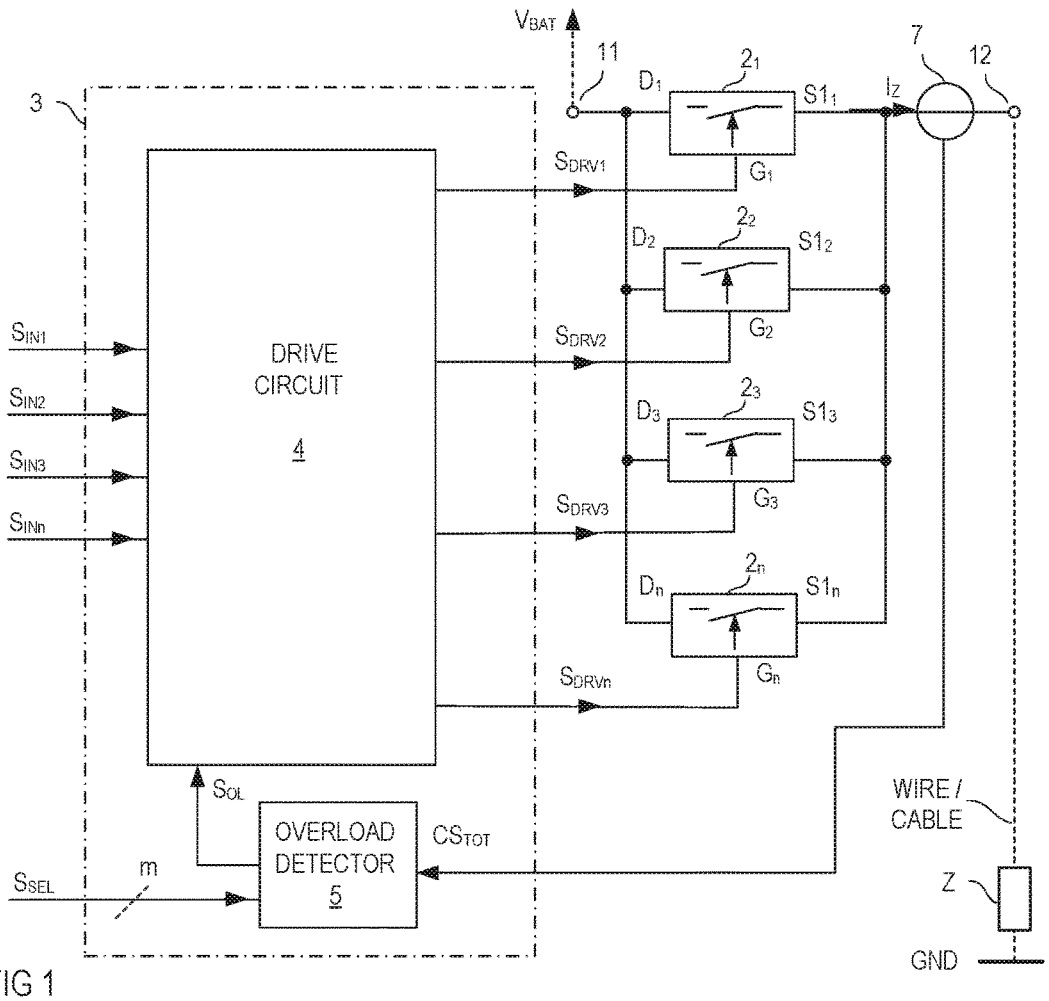
FIG. 1 shows one example of an electronic circuit with a plurality of electronic switches, a current sense circuit, and a control circuit including a drive circuit and an overload detector.

FIG. 1 shows one example of an electronic circuit that functions as an electronic switch and as a protection circuit. This type of electronic circuit may be referred to as electronic switch and protection circuit in the following. Referring to FIG. 1, the electronic switch and protection circuit includes a plurality of electronic switches $2_1$-$2_n$. Each of these electronic switches $2_1$-$2_n$ includes a control node $G_1$-$G_n$ and a load path between a first load node $D_1$-$D_n$ and a second load node $S1_1$-$S1_n$. The load paths of the electronic switches $2_1$-$2_n$ are connected in parallel between a first load node 11 and a second load node 12 of the switch and protection circuit. A current sense circuit 7 is configured to sense a load current Iz between the first load node 11 and the second load node 12 and generate a current sense signal $CS_{TOT}$ that represents the load current Iz. The current sense circuit 7 is only schematically illustrated in FIG. 1.

Examples of how the current sense circuit 7 may be implemented are explained in further detail herein below. According to one example, the electronic switches $2_1$-$2_n$ have essentially the same on-resistance, which is the ohmic resistance in an on-state (switched on state). This may be obtained by implementing the electronic switches $2_1$-$2_n$ with the same size. The electronic switches $2_1$-$2_n$ may each be implemented as a transistor with a plurality of transistor cells that are internally connected in parallel. "Implementing electronic switches $2_1$-$2_n$ with the same size" may include implementing the electronic switches 21-2n with essentially the same number of transistor cells. According to another example, at least two of the electronic switches $2_1$-$2_n$ have different on-resistances. This may be obtained by implementing at least two of the electronic switches with different sizes. According to yet another example, each of the electronic switches $2_1$-$2_n$ has an on-resistance different from the on-resistances of the remainder of the electronic switches.

Referring to FIG. 1, the electronic circuit further includes a control circuit 3 with a drive circuit 4 and an overload detector 5. The drive circuit 4 is configured to select and switch on at least one of the plurality of electronic switches $2_1$-$2_n$ based on at least one input signal received by the drive circuit 4. In the example shown in FIG. 1, the drive circuit 4 receives a plurality of input signals $S_{IN1}$-$S_{INn}$, wherein each of these input signals $S_{IN1}$-$S_{INn}$ is associated with one of the plurality of electronic switches $2_1$-$2_n$. Each of these input signals $S_{IN1}$-$S_{INn}$ indicates whether the corresponding electronic switch $2_1$-$2_n$ is to be switched on or switched off, wherein the drive circuit 4 is configured to generate a drive signal $S_{DRV1}$-$S_{DRVn}$ based on each of the input signals $S_{IN1}$-$S_{INn}$. Each of the electronic switches $2_1$-$2_n$ receives a corresponding one of the drive signals $S_{DRV1}$-$S_{DRVn}$ at its gate node $G_1$-$G_n$ and switches on or off dependent on a signal level of the corresponding drive signal $S_{DRV1}$-$S_{DRVn}$. A first electronic switch $2_1$, for example, receives a first drive signal $S_{DRV1}$, wherein this first drive signal $S_{DRV1}$ is generated by the drive circuit 4 dependent on a first input signal $S_{IN1}$, a second electronic switch $2_2$ receives a second drive signal $S_{DRV2}$ generated by the drive circuit 4 based on a second input signal $S_{IN2}$, and so on.

The overload detector 5 receives the current sense signal $CS_{TOT}$ and is configured to detect an overload scenario and generate an overload signal $S_{OL}$ based on this detection and based on a select signal $S_{SEL}$. The drive circuit 4 receives the overload signal $S_{OL}$. According to one example, the drive circuit 4 is configured to switch off each of the electronic switches $2_1$-$2_n$, independent of the respective input signal $S_{IN1}$-$S_{INn}$, if the overload signal $S_{OL}$ indicates that an overload scenario has been detected. This function of the drive circuit 4 is explained with reference to the timing diagrams shown in FIG. 2.

Figure 2:
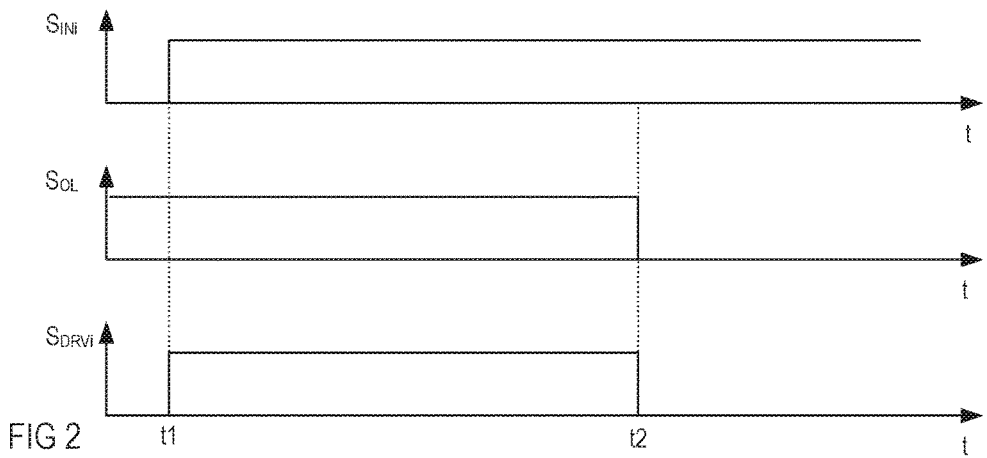
FIG. 2 schematically shows timing diagrams of certain signals in the electronic circuit shown in FIG. 1.

FIG. 2 shows timing diagrams of an input signal $S_{INi}$, a drive signal $S_{DRVi}$ generated by the drive circuit 4 based on the input signal $S_{INi}$, and the overload signal $S_{OL}$. The signal $S_{INi}$ illustrated in FIG. 2 represents an arbitrary one of the plurality of input signals $S_{IN1}$-$S_{INn}$ shown in FIG. 1. According to one example, the input signal $S_{INi}$ has an on-level or an off-level. An on-level of the input signal $S_{INi}$ indicates that it is desired to switch on the electronic switch $2_i$ associated with the input signal $S_{INi}$, and an off-level indicates that it is desired to switch off the respective electronic switch $2_i$. Just for the purpose of explanation, it is assumed that a high signal level of the input signal $S_{INi}$ shown in FIG. 2 represents the on-level and a low signal level represents the off-level.

According to one example, the overload signal $S_{OL}$ has an overload level indicating that an overload scenario has been detected or a non-overload level indicating that the electronic circuit is in a normal mode. The "normal mode" is an operation mode in which an overload scenario has not been detected. Just for the purpose of illustration, the overload level is drawn as a low signal level and the non-overload level is drawn as a high signal level in the example shown in FIG. 2.

The drive signal $S_{DRVi}$ shown in FIG. 2 is a drive signal generated by the drive circuit 4 based on the corresponding input signal $S_{INi}$. Referring to the above, the drive circuit 4 generates the drive signal $S_{DRVi}$ based on the corresponding input signal $S_{INi}$ and the overload signal $S_{OL}$. The drive signal $S_{DRVi}$ may have an on-level that switches on the corresponding electronic switch $2_i$ or an off-level that switches off the corresponding electronic switch $2_i$. Just for the purpose of illustration, an on-level of the drive signal $S_{DRVi}$ is drawn as a high signal level and the off-level is drawn as a low signal level in the example shown in FIG. 2.

Referring to FIG. 2, the drive circuit 4 generates an on-level of the drive circuit $S_{DRVi}$ when the input signal $S_{INi}$ has an on-level and the overload signal $S_{OL}$ has a non-overload level. When the overload signal $S_{OL}$ has the non-overload level the electronic switches $2_1$-$2_n$ are enabled to be switched on or off dependent on the corresponding input signal $S_{IN1}$-$S_{INn}$. In FIG. 2, this is illustrated between a first time t1, at which the input signal $S_{INi}$ changes from the off-level to the on-level, and a second time t2. In this example, an overload is detected by the overload detector 5 at the second time t2 so that at this time t2 the overload signal $S_{OL}$ changes from the non-overload level to the overload level (from the high level to the low level in this example). The overload level disables the electronic switches $2_1$-$2_n$ so that, independent of the signal level of the corresponding input signal $S_{INi}$, an off-level of the drive signal $S_{DRVi}$ is generated by the drive circuit 4 in order to switch off the electronic switch $2_i$ (and each of the other electronic switches).

The drive circuit 4 may be configured to enable or disable the electronic switches $2_1$-$2_n$ only dependent on the overload signal. In this case, the drive circuit 4 disables the electronic switches $2_1$-$2_n$, that is, it maintains the electronic switches $2_1$-$2_n$ in the switched-off state (which is referred to as off-state in the following) as long as the overload signal $S_{OL}$ has an overload level and again enables the electronic switches $2_1$-$2_n$ when the signal level of the overload signal $S_{OL}$ changes from the overload level to the non-overload level. According to another example, the drive circuit 4 is configured to disable the electronic switches $2_1$-$2_n$ when the overload signal $S_{OL}$ has an overload level and maintains the electronic switches $2_1$-$2_n$ in the disabled state independent of the signal level of the overload signal $S_{OL}$ until the input signals $S_{IN1}$-$S_{INn}$ have changed to an off-level. Only after each of the input signals $S_{IN1}$-$S_{INn}$ have changed to an off-level are the electronic switches $2_1$-$2_n$ again enabled and may be switched on based on the input signals $S_{IN1}$-$S_{INn}$.

The input signals $S_{IN1}$-$S_{INn}$ shown in FIG. 1 may be generated by an external control circuit (not shown in the figures) that controls operation of the electronic circuit shown in FIG. 1. This control circuit may be implemented as a microcontroller. According to another example shown in FIG. 3, the electronic circuit receives one input signal $S_{IN}$ that includes both the select information that indicates which of the electronic switches $S1_1$-$S1_n$ is to be switched on (is to be selected) and the timing information that indicates when the selected switch(es) is/are to be switched on. An interface circuit 8 generates the input signals $S_{IN1}$-$S_{INn}$ explained with reference to FIG. 1 based on the one input signal $S_{IN}$ and provides these input signals $S_{IN1}$-$S_{INn}$ to the drive circuit 4. As explained with reference to FIG. 1, the drive circuit 4 generates the drive signals $S_{DRV1}$-$S_{DRVn}$ based on the input signals $S_{IN1}$-$S_{INn}$. The interface circuit 8 may be implemented as an SPI (Serial Parallel Interface) circuit. Optionally, the interface circuit 8 further receives, additionally to the input signal $S_{IN}$, an enable signal $S_{EN}$ and a clock signal $S_{CLK}$.

The interface circuit may include an internal memory (not shown), such as a register, with a plurality of memory cells. Each of these memory cells is associated with one of the input signals $S_{IN1}$-$S_{INn}$ and stores a value that represents the desired signal level (on-level or off-level) of the corresponding input signal. The drive circuit 4 retrieves these values that represent the signal levels of the input signals $S_{IN1}$-$S_{INn}$ from the interface circuit 8. The values stored in the internal memory are included in the input signal $S_{IN}$ received by the interface circuit 8. According to one example, the input signal $S_{IN}$ includes a sequence of data packets, with each of these data packets including the values to be stored in the internal memory. In this example, the interface circuit 8 may be configured to write the values included in the data packets into the memory cells based on the clock signal $S_{CLK}$ so that new values are written into the memory cells in every clock cycle. According to one example, the interface circuit is configured to write values based on the input signal $S_{IN}$ into the memory cells only when the enable signal $S_{EN}$ has a predefined signal level, which may be referred to as enable level.

The select signal $S_{SEL}$ received by the overload detector selects one of several different overload characteristics (protection characteristics) implemented in the overload detector. These overload characteristics (and how they may be realized) are explained in further detail herein below. The select signal $S_{SEL}$ may be provided by the same external control circuit that generates the at least one input signal $S_{IN1}$-$S_{INn}$. According to one example shown in FIG. 3, the select signal (which may also be referred to as select information) is included in the serial input signal and is retrieved from the input signal $S_{IN}$ by the interface circuit 8. According to one example that is illustrated in dashed lines in FIGS. 1 and 3, the select signal $S_{SEL}$ is represented by a binary word with m bit. This binary word can have $2^m-1$ different values so that $2^m-1$ different overload characteristics can be selected using this type of selection signal $S_{SEL}$.

The input signals $S_{IN1}$-$S_{INn}$ received by the drive circuit 4 may be such that only one of these input signals $S_{IN1}$-$S_{INn}$ has an on-level at one time, so that only one of the electronic switches $2_1$-$2_n$ is switched on at one time. According to another example, more than one of the input signals $S_{IN1}$-$S_{INn}$ may have an on-level at one time in order to switch on two or more of the electronic switches $2_1$-$2_n$ at the same time and provide several parallel current paths between the load nodes 11, 12 of the switch and protection circuit. In the following, an electronic switch is referred to as active electronic switch if the corresponding input signal has an on-level, and one or more electronic switches that are active at the same time are referred to as group of active electronic switches. If, for example, there are n electronic switches $2_1$-$2_n$ and more than one electronic switch can be active at the same time, there are $2^n-1$ different groups of active electronic switches, that is, $2^n-1$ different combinations of electronic switches $2_1$-$2_n$ that are switched on at the same time.

Referring to the above, the electronic circuit has a switching function and a protection function. The "switching function" includes that the electronic circuit is configured to connect a load to a power source or disconnect the load from the power source. The "protection function" includes that the electronic circuit, by switching off the electronic switches $2_1$-$2_n$, disconnects the load from the power source when an overload scenario has been detected. One way of how the electronic circuit and the load Z can be interconnected is illustrated in dashed lines in FIGS. 1 and 3. In these examples, a load path of the electronic circuit is connected in series with the load Z, wherein the series circuit with the load Z and the load path of the electronic circuit is connected to a power source. The power source is represented by a first supply potential $V_{BAT}$ and a second supply potential GND in FIGS. 1 and 3. Just for the purpose of explanation, it is assumed that the first supply potential is a positive supply potential and the second supply potential is ground. According to one example, the power source is an automotive battery, and the load Z is an electric load in an automobile such as a motor (other than the motor driving the automobile), a light, any type of electronic circuit, or the like.

In an automobile, a first supply node, where the first supply potential $V_{BAT}$ is available, may be a terminal of the automobile battery, while a second supply node, where the second supply potential (ground) is available, may be a chassis of the automobile. According to one example, the load Z is connected to the second supply node (the chassis) close to the position where the load is located in the car, and the load Z is connected to the first supply node via a cable. The load path 11-12 of the electronic circuit can be located at any position in the cable between the first supply node and the load Z. According to one example, the electronic circuit is either located close to the automobile battery (represented by the first supply node in FIG. 3) or close to the load Z.

Figure 3:
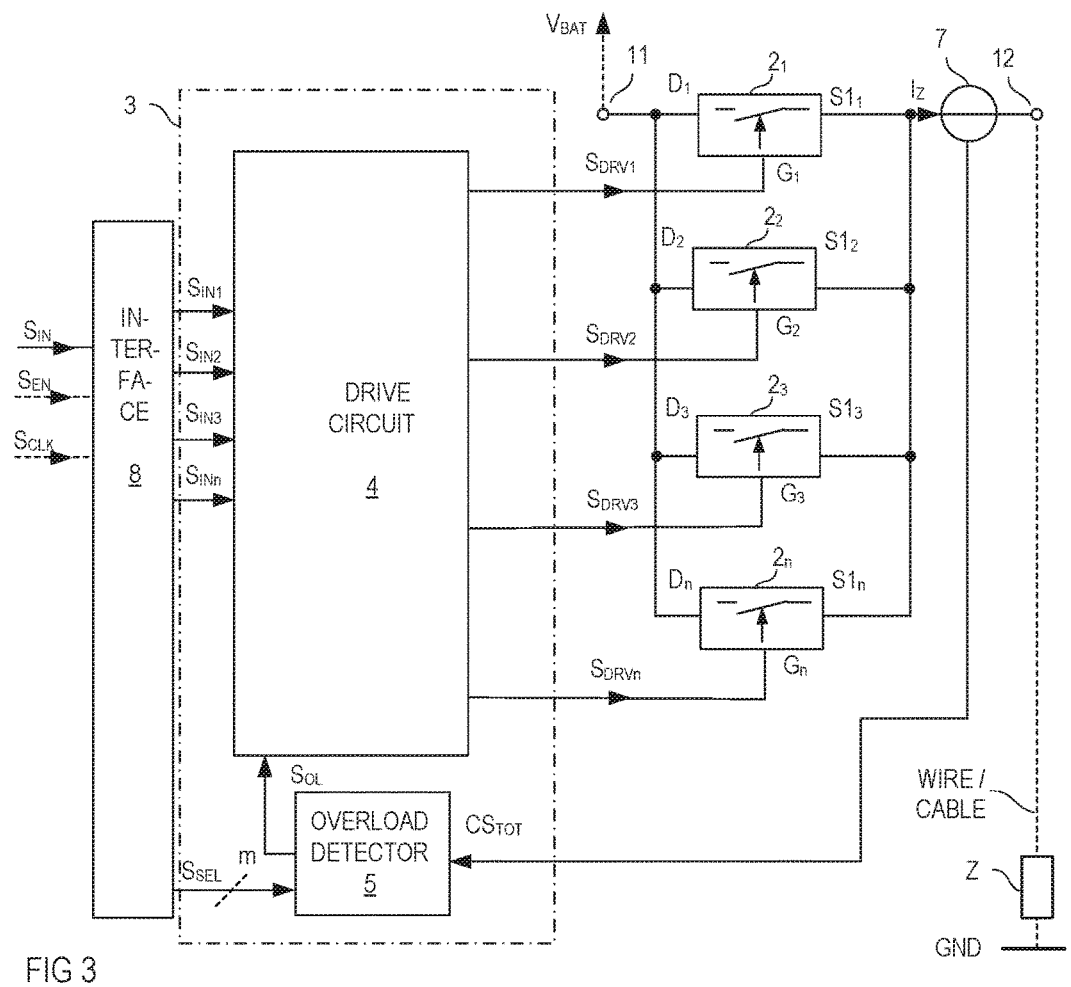
FIG. 3 shows another example of an electronic circuit with a plurality of electronic switches, a current sense circuit, and a control circuit including a drive circuit and an overload detector.

The different electric loads that are installed in a modern automobile usually have different current consumptions. The current consumptions of these loads may range from several milliamps to several 10 amps. In order to save resources and costs, a cross-sectional area of the cables used to connect the individual loads to the automotive battery may be adapted to the current consumption of the respective load. As the individual cables can be up to several meters long, significant resources, weight and cost can be saved by this approach. For example, a load with a current consumption of 0.1 A may be supplied via a cable with a cross-sectional area of 0.13 square millimeters ($mm^2$), a load with a power consumption of 3 A may be supplied via a cable with a cross-sectional area of 0.35 $mm^2$, a load with a power consumption of 6 A may be supplied via a cable with a cross-sectional area of 0.75 $mm^2$, and a load with a power consumption of 30 A may be supplied via a cable with a cross-sectional area of 4 $mm^2$, to give only a few examples. The electronic circuit shown in FIGS. 1 and 3 is not only configured to switch on and off the current between the power source and the load Z, but is also configured to protect the cable from becoming overheated or even being destroyed. This is explained in further detail with reference to FIG. 4 herein below. The capacity of a cable to withstand certain current levels, however, is not only dependent on the cross sectional area. The cable usually includes a core and an insulation around the core. Above and in the following, "cross sectional area" means cross sectional area of the core. Parameters that, additionally to the cross sectional area of the core, influence the capacity of the cable to withstand certain current levels are the type of material of the core, the structure of the core (for example, solid core or strand), and the type of material of the insulation. The type of insulation material defines the maximum temperature the cable can withstand. As the cable temperature usually increases when the current increases, the type of insulation material may be one of the limiting factors. Thus, two cables with identical cores but different insulations may have different current capacities, wherein the "current capacity" defines the maximum current level the cable can withstand for a certain time without being damaged or destroyed.

Figure 4:
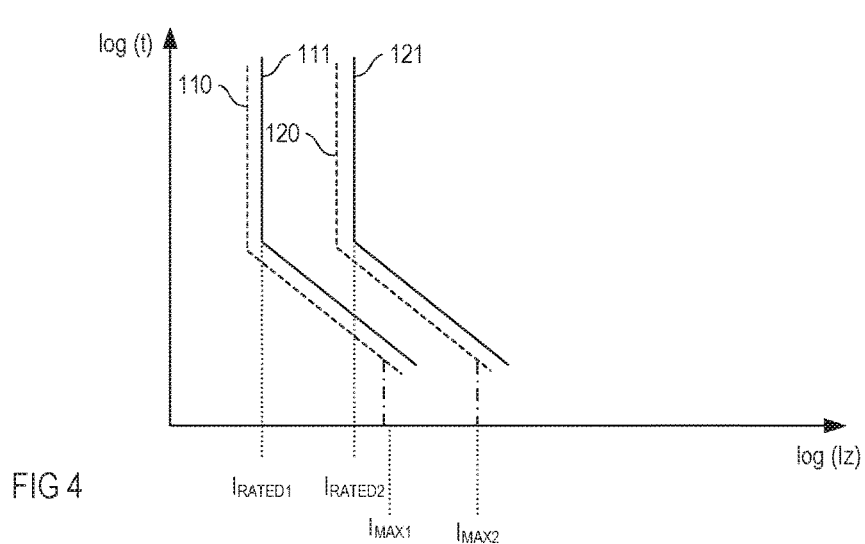
FIG. 4 schematically illustrates two different "fuse characteristics" of an electronic circuit according to one of FIGS. 1 and 3.

For the purpose of illustration, FIG. 4, on a logarithmic scale, shows the characteristic curves of two cables (wires) with different current capacities, wherein these different current capacities, as explained above, may result from different internal parameters of the cable such as cross-sectional area, core structure, and insulation etc. and also external parameters such as an ambient temperature. In particular, FIG. 4 shows $I^2t$ curves of the individual cables. Each of these curves represents a plurality of currents Iz and times t associated with the individual currents. The time associated with one current is the time for which the cable can withstand the respective current without being damaged or destroyed. According to one example, this time is the time it takes for the cable to reach the maximum allowed temperature (which may also be referred to as rated temperature). The individual curves are based on the formula $Iz^2 \cdot t = c$, where c is a constant that is dependent on the cross-sectional area of the respective cable and a temperature change the cable can withstand. Basically, the higher the rated temperature is the longer the time for which a cable can withstand a certain current will be. A rate at which the cable temperature increases when a certain current flows through it is dependent on several parameters such as the core structure, the cross sectional area of the core and the core material. The time for which a cable can withstand a certain current increases, for example, as the cross-sectional area of the core increases. In FIG. 4, the curve labeled with 111 represents the characteristic curve of a cable with a first current capacity and the curve labeled with 121 represents the characteristic curve of a second cable with a second current capacity higher than the first current capacity. The cable represented by curve 111 is capable of withstanding over a long range a first rated current $I_{RATED1}$, and the cable represented by curve 121 is capable of withstanding over a long range a second rated current $I_{RATED2}$ higher than the first rated current. If the load current increases to above the respective rated current, the time for which the respective cable can withstand the load current decreases as the load current increases.

Each of the electronic circuits shown in FIGS. 1 and 3 is configured to protect different types of cables, that is, cables with different current capacities. "To protect a cable" means to interrupt an electrical connection between the first load node 11 and the second load node 12 by switching off each of the electronic switches $2_1$-$2_n$ before a critical situation as defined by the characteristic curve of the cable occurs. Referring to FIG. 4, the cable represented by curve 111 can be protected if the electronic circuit switches off in accordance with a curve 110 shown in dashed lines in FIG. 4, and a cable represented by curve 121 can be protected if the electronic switch switches off in accordance with a curve 120 shown in dashed lines in FIG. 4. These curves 110 and 120 are referred to as "trip curves" or "protection characteristics" in the following. According to one example, the electronic circuit is configured to generate the overload signal $S_{OL}$ based on one of several protection characteristics implemented in the overload detector 5, wherein the protection characteristic used by the overload detector 5 is defined by the select signal $S_{SEL}$. Thus, the electronic circuit can be adjusted, for example, to switch off in accordance with curve 110 to protect a cable with characteristic curve 111 or switch off in accordance with curve 120 to protect a cable with curve 121. It should be mentioned that FIG. 4 illustrates only two different trip curves of the electronic circuit. According to one example illustrated in dashed and dotted lines in FIG. 4, each of the trip curves has a maximum current $I_{MAX1}$, $I_{MAX2}$, wherein the electronic circuit immediately switches off when the load current reaches the corresponding maximum current.

According to one example, the electronic circuit has a different trip curve or overload characteristic for each group of active electronic switches $2_1$-$2_n$ (for each group of electronic switches that can be switched on at the same time). According to another example, the electronic circuit has two or more protection characteristics for each of these groups.

The individual trip curves (protection characteristics) are implemented in the overload detector 5. The overload detector 5 selects one trip curve based on the select signal (select information) $S_{SEL}$. "To select one trip curve" means to switch off the electronic circuit based on one of a plurality of trip curves, for example of the type shown in FIG. 4. "To switch off the electronic circuit" means to switch off each of the electronic switches $2_1$-$2_n$ such that a current connection between the first and second load nodes 11, 12 is interrupted. Based on the current sense signal $CS_{TOT}$ and the selected trip curve, the overload detector 5 switches off the active electronic switches in order to protect the cable, if necessary.

Figure 5:
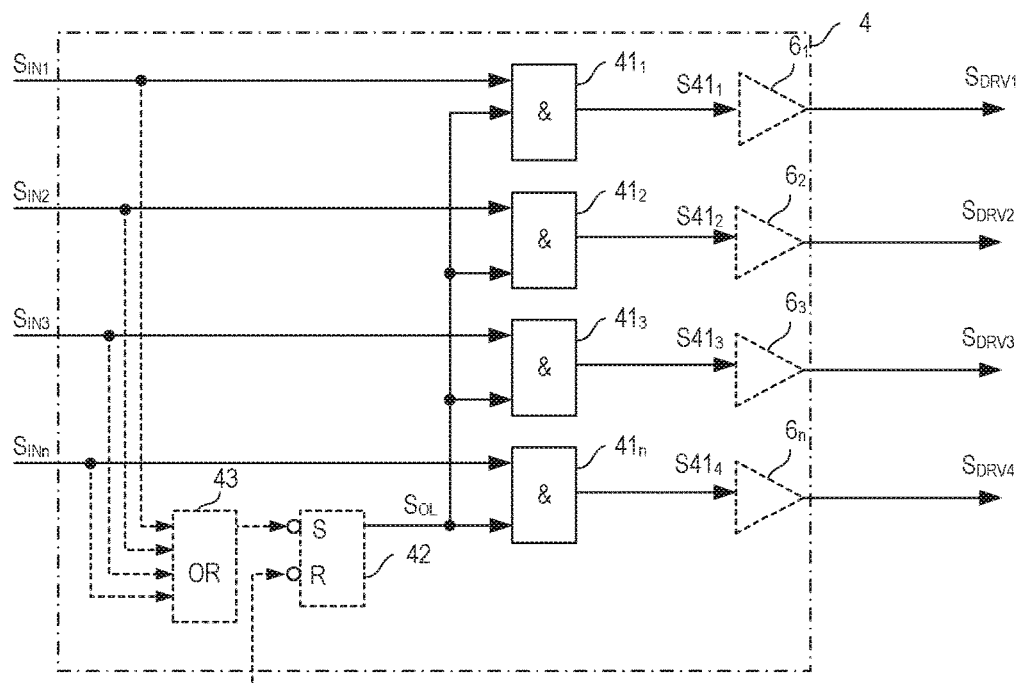
FIG. 5 shows one example of the drive circuit in greater detail.

FIG. 5 shows one example of the drive circuit 4 shown in FIGS. 1 and 3. Referring to FIG. 5, the drive circuit 4 includes a plurality of logic gates $41_1$-$41_n$, wherein each of these logic gates $41_1$-$41_n$ receives the overload signal $S_{OL}$ and a corresponding one of the input signals $S_{IN1}$-$S_{INn}$. Each of these logic gates $41_1$-$41_n$ generates one of the drive signals $S_{DRV1}$-$S_{DRVn}$. Optionally, a driver $6_1$-$6_n$ is connected downstream each of the plurality of logic gates $41_1$-$41_n$, receives an output signal $S41_1$-$S41_n$ from the corresponding logic gate $41_1$-$41_n$ and generates the drive signal $S_{DRV1}$-$S_{DRVn}$ based on the logic gate output signal it receives. Basically, the drivers $6_1$-$6_n$ are configured to generate the drive signals $S_{DRV1}$-$S_{DRVn}$ by amplifying the logic gate output signals $S41_1$-$S41_n$ such that signal levels of the drive signals $S_{DRV1}$-$S_{DRVn}$ are suitable to drive the electronic switches $2_1$-$2_n$ shown in FIGS. 1 and 3.

Each of the logic gates $41_1$-$41_n$ is configured to generate the respective drive signal $S_{DRV1}$-$S_{DRVn}$ such that the drive signal $S_{DRV1}$-$S_{DRVn}$ has an on-level only if the overload signal $S_{OL}$ has a non-overload level and the associated input signal $S_{IN1}$-$S_{INn}$ has an on-level. If, as illustrated in FIG. 2, an on-level of the input signals $S_{IN1}$-$S_{INn}$ is a high signal level and the non-overload level of the overload signal $S_{OL}$ is a high signal level, the logic gates may be implemented as AND gates (as shown in FIG. 5). This, however, is only an example dependent on the type of the input signals $S_{IN1}$-$S_{INn}$ and the overload signal $S_{OL}$ other types of logic gates may be used in order to generate the drive signals $S_{DRV1}$-$S_{DRVn}$.

Figure 6:
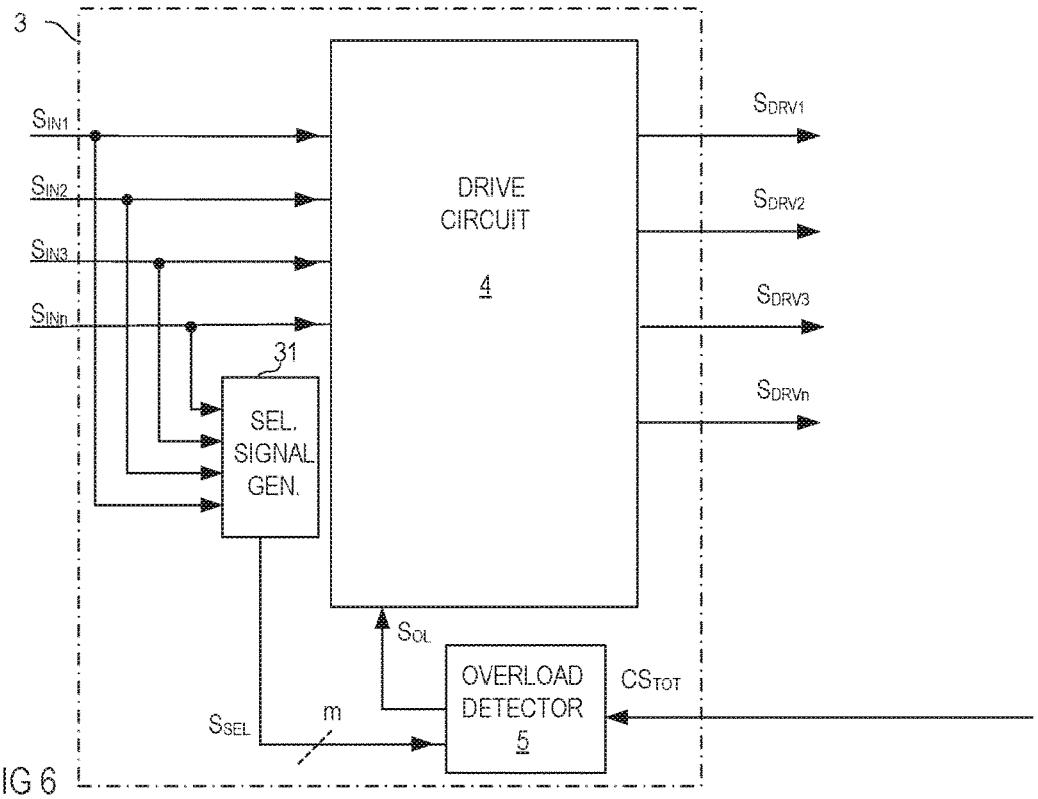
FIG. 6 shows another example of the control circuit.

In the previously explained example, the electronic switches $2_1$-$2_n$ are disabled as long as the overload signal $S_{OL}$ has an overload level. Optionally, and as illustrated in dashed lines in FIG. 5, the logic gates $41_1$-$41_n$ do not receive the overload signal $S_{OL}$ but receive an output signal from a latch 42, wherein this output signal is dependent on the overload signal $S_{OL}$ and the input signals $S_{IN1}$-$S_{INn}$. According to one example, the latch 42 output signal either has an overload level or a non-overload level. The overload level of the latch 42 output signal disables the electronic switches $2_1$-$2_n$ that is, causes the logic gates $41_1$-$41_n$ to generate off-levels of the drive signals $S_{DFV1}$-$S_{DFVn}$ independent of signal levels of the input signals $S_{IN1}$-$S_{INn}$. The non-overload level of the latch 42 output signal enables the electronic switches $2_1$-$2_n$ that is, causes the logic gates $41_1$-$41_n$ to generate the drive signals $S_{DFV1}$-$S_{DFVn}$ dependent on the input signals $S_{IN1}$-$S_{INn}$. According to one example, the latch 42 is configured to generate an overload level of the latch output signal each time the overload signal $S_{OL}$ has an overload level. Further, the latch 42 is configured to maintain the overload level of the latch 42 output signal until the electronic circuit has been switched off, that is, until each of the input signals $S_{IN1}$-$S_{INn}$ has an off-level. This may be achieved by implementing the latch as an SR-flip flop that receives the overload signal at an inverting reset input R and generating a set signal of the latch 42 by ORing the input signals $S_{IN1}$-$S_{INn}$ using an OR gate 43. This set signal is received by an inverting set input of the latch 42 according to one example. The optional latch 42, together with the logic gate 43, cause the drive circuit 4 to maintain the electronic switches $2_1$-$2_n$ disabled once the overload signal $S_{OL}$ has an overload level until each of the input signals $S_{IN1}$-$S_{INn}$ has an off-level. FIG. 6 shows a control circuit 3 according to another example. In this example, the control circuit 3 includes a select signal generator 31. The select signal generator 31 receives the input signals $S_{IN1}$-$S_{INn}$ and generates the select signal $S_{SEL}$ based on the input signals $S_{IN1}$-$S_{INn}$ such that the select signal $S_{SEL}$ indicates which of the input signals $S_{IN1}$-$S_{INn}$ has an on-level, that is, which of the electronic switches $2_1$-$2_n$ are to be switched on. In this example, the select signal $S_{SEL}$ and, therefore, the protection characteristic is dependent on which of the electronic switches $2_1$-$2_n$ is active. As in the previously explained examples, the select signal $S_{SEL}$ can be a digital word with m bit.

Figure 7:
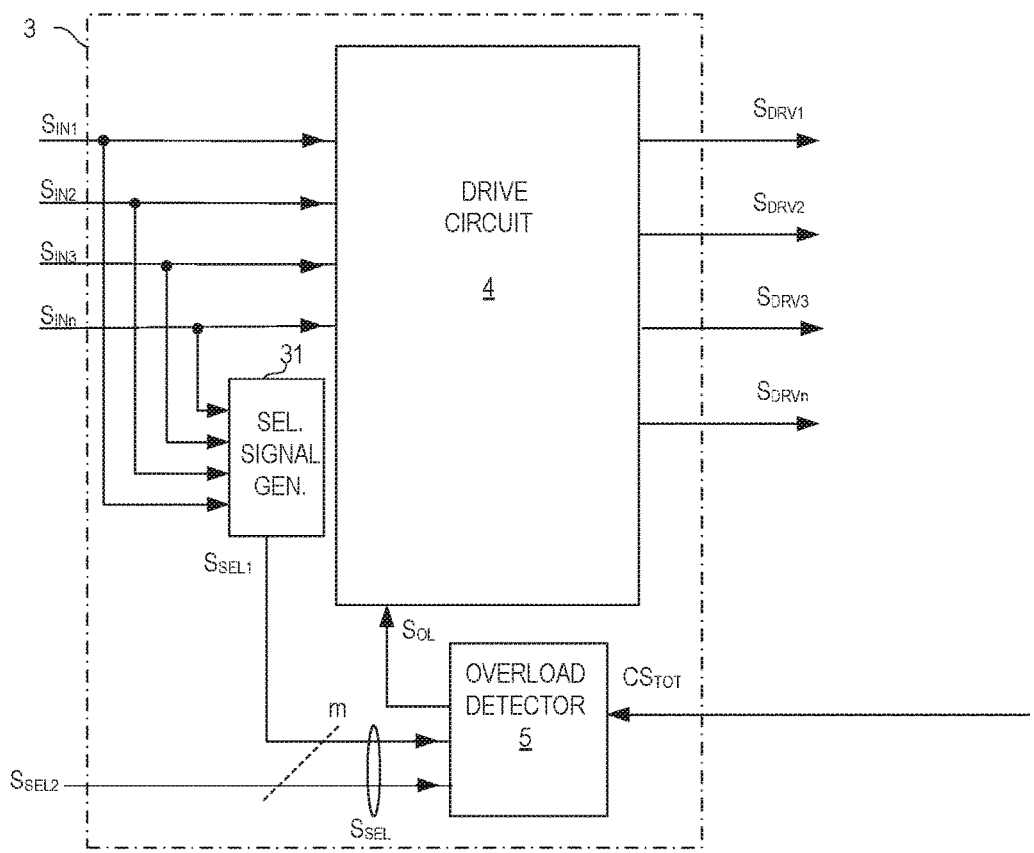
FIG. 7 illustrates a modification of the control circuit shown in FIG. 6.

FIG. 7 shows a modification of the control circuit 3 shown in FIG. 6. In the control circuit 3 shown in FIG. 7, the select signal generator 31 generates a first select signal $S_{SEL1}$ based on the input signals $S_{IN1}$-$S_{INn}$ and the control circuit 3 further receives a second select signal $S_{SEL2}$. This second select signal $S_{SEL2}$ may be received from the external control circuit, either directly or via the interface circuit 8. The first select signal $S_{SEL1}$ and the second select signal $S_{SEL2}$ together form the select signal $S_{SEL}$ received by the overload detector 5. In this example, the overload detector 5 may be implemented such that it includes several groups of protection characteristics, wherein each of these groups is associated with one combination of active electronic switches and includes two or more protection characteristics. In this example, the first select signal $S_{SEL1}$, based on the input signals $S_{IN1}$-$S_{INn}$, selects one of these groups of protections characteristics, and the second select signal $S_{SEL2}$ selects one of the protection characteristics from this group.

The current measurement circuit 7 that is configured to measure the load current Iz between the first load node 11 and the second load node 12 is only schematically illustrated in FIG. 1. According to one example shown in FIG. 8, the current measurement circuit 7 includes a plurality of current sensors $70_1$-$70_n$, wherein each of these current sensors $70_1$-$70_n$ is configured to measure the current through a respective electronic switch $2_1$-$2_n$ and generate a current measurement signal $CS_1$-$CS_n$ that represents the current through the respective electronic switch $2_1$-$2_n$. A signal adder 71 receives the current measurement signals (which may also be referred to as current sense signals) $CS_1$-$CS_n$ from the individual current sensors $70_1$-$70_n$ and generates, based on these current sense signals $CS_1$-$CS_n$, the overall current measurement signal $CS_{TOT}$ that represents the load current Iz. According to one example, the signal adder generates the overall current measurement signal $CS_{TOT}$ such that a signal level of this overall current measurement signal $CS_{TOT}$ equals a sum of the signal levels of the individual current measurement signals $CS_1$-$CS_n$.

Figure 9:
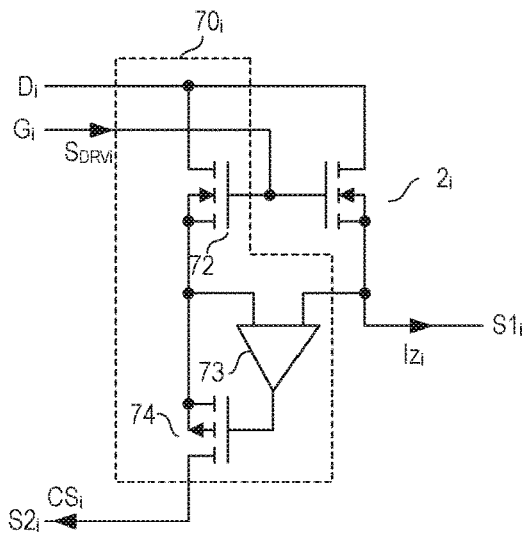
FIG. 9 shows one example of a switch circuit in greater detail.

FIG. 9 shows one example of an electronic switch and an associated current sensor. The "associated current sensor" is configured to measure the current through the electronic switch. Reference character $2_i$ in FIG. 9 denotes an arbitrary one of the previously explained electronic switches $2_1$-$2_n$, and reference character $70_i$ denotes the associated current sensor. $D_i$ denotes the first load node, $S_i$ denotes the second load node, and $G_i$ denotes the control node of the electronic switch $2_i$. $S2_i$ denotes an output node of the current sensor $70_i$. At the output node of the current sensor $70_i$ a current sense signal $CS_i$ that represents the current through the electronic switch $2_i$ is available. In the example shown in FIG. 9, the electronic switch $2_i$ is a MOSFET. A drain node of this MOSFET forms the first load node $D_i$, a source node forms the second load node $S_i$, and a gate node forms the control node $G_i$. The MOSFET $2_i$ is drawn as an n-type enhancement MOSFET in the example shown in FIG. 9. This, however, is only an example. Any other type of MOSFET such as an n-type depletion MOSFET or a p-type enhancement or depletion MOSFET may be used as well. Furthermore, the electronic switch $2_i$ is not restricted to be implemented as a MOSFET. Any other type of transistor such as, for example, a bipolar junction transistor (BJT), an insulated gate bipolar transistor (IGBT), a junction field-effect transistor (JFET), or a high electron-mobility transistor (HEMT) may be used as well.

Referring to FIG. 9, the current sensor $70_i$ includes a transistor 72 of the same type as the transistor of the electronic switch $2_i$. This further transistor 72 is referred to as sense transistor in the following. A control node (gate node) of the sense transistor 72 is connected to the control node $G_i$ of the transistor forming the electronic switch $2_i$, and a first load node (drain node) of sense transistor 72 is connected to the first load node $D_i$ of the transistor forming the electronic switch $2_i$. A regulator 73, 74 is coupled between the second load node $S1_i$ of the electronic switch $2_i$ and a second load node of the sense transistor 72 and is configured to adjust an electrical potential at the second load node of the sense transistor 72 such that it equals the electrical potential at the second load node $S1_i$ of the transistor forming the electronic switch $2_i$. In this case, the transistor forming the electronic switch $2_i$ and the sense transistor 72 are operated in the same operation point so that a current $Iz_i$ through the electronic switch $2_i$ is proportional to a current I72 through the sense transistor 72. This current I72 through the sense transistor 72 is the current sense signal $CS_i$ (which may also be referred to as sense current) in this example. A proportionality factor between the load current $Iz_i$ and the sense current $CS_i$ is given by a ratio between a size of the transistor forming the electronic switch $2_i$ and the size of the sense transistor 72.

Referring to FIG. 9, the regulator may include an operational amplifier 73 with a first input coupled to the second load node $S1_i$ of the electronic switch $2_i$ and a second input coupled to the second load node of the sense transistor 72. An output of this operational amplifier 73 controls a variable resistor 74 connected in series with the sense transistor 72. According to one example, this variable resistor 74 is a transistor, such as a p-type MOSFET 74 shown in FIG. 9.

Figure 10:
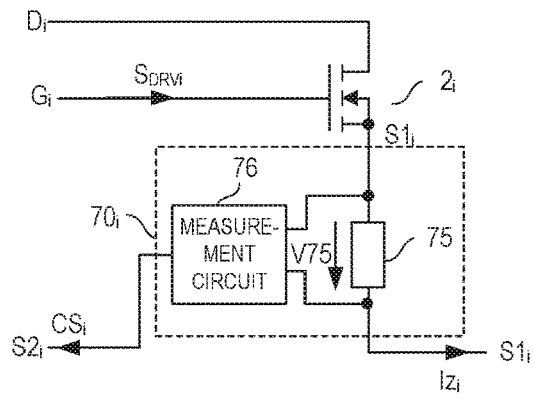
FIG. 10 shows another example of a switch circuit in greater detail.

FIG. 10 shows another example of an electronic switch $2_i$ and an associated current sensor $70_i$. In this example, the current sensor includes a shunt resistor 75 connected in series with the load path (the drain-source path when the electronic switch is a MOSFET) of the electronic switch $2_i$ and a measurement circuit (drain-source path) configured to measure a voltage V75 across the shunt resistor 75 and generate the sense signal $CS_i$ based on this measurement. The measurement circuit 76 is configured to generate the sense signal $CS_i$ to be proportional to the voltage V75 across the shunt resistor 75. Further, this voltage V75, in accordance with Ohm's law, is proportional to a load current $Iz_i$ through the electronic switch $2_i$ in the on-state, so that the sense signal $CS_i$ is proportional to the load current $Iz_i$. A proportionality factor between the load current $Iz_i$ and the voltage V75 across the shunt resistor 75 is dependent on a resistance of the shunt resistor V75.

The shunt resistor can be any type of resistor. According to one example, the shunt resistor is part of a connection that connects the second load node $S1_i$ of the electronic switch $2_i$ to the second load node 12 of the electronic circuit. The electronic switch $2_1$ and the current sensor may be integrated in a semiconductor chip (not shown in the drawings). In this example, the shunt resistor 75 may be part of a connection that connects the chip to the second load node 12 of the electronic circuit, in particular, the shunt resistor may be a bond wire or a flat conductor.

Figure 8:
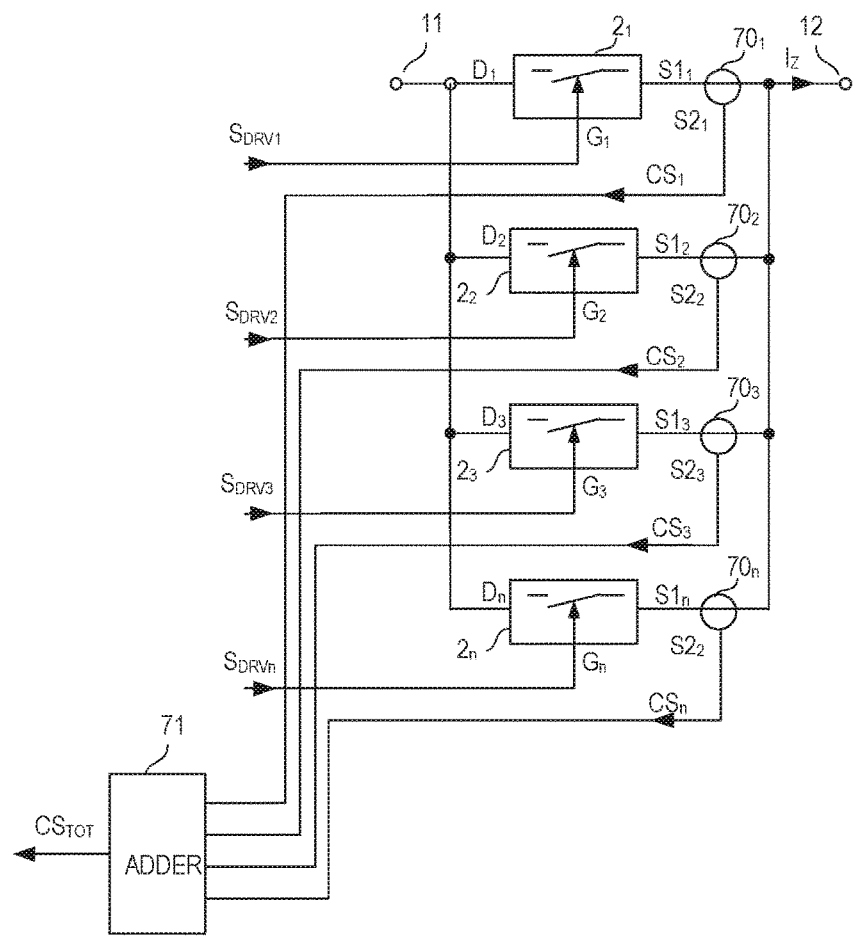
FIG. 8 schematically illustrates a plurality of switch circuits that each include an electronic switch and a current sensor of the current sense circuit.

According to one example, the measurement circuit 76 is configured to generate the sense signal $CS_i$ to be a current. In this example, the measurement circuit 76 may include a voltage to current converter. According to another example, the adder 71 shown in FIG. 8 is configured to add voltages instead of currents. In this example, the voltage across the shunt resistor may be used directly as the current sense signal $CS_i$ so that the measurement circuit 76 may be omitted.

Figure 11:
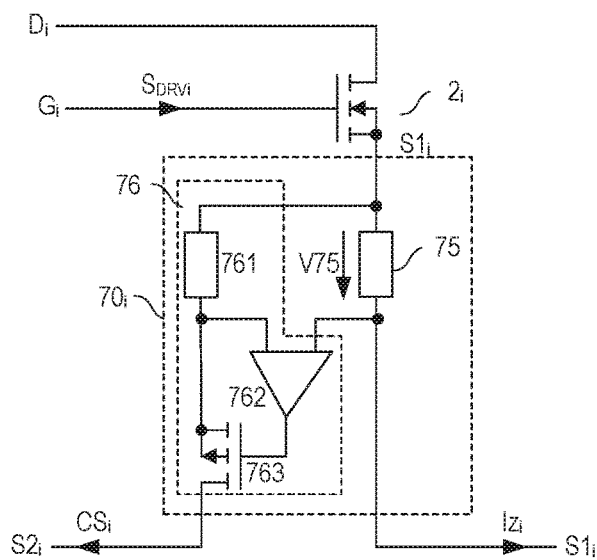
FIG. 11 shows a measurement circuit of the switch circuit shown in FIG. 10 in greater detail.

FIG. 11 shows one example of a measurement circuit 76 configured to generate a sense current $CS_i$ based on the voltage V75 across the shunt resistor 75. This measurement circuit 76 is similar to the measurement circuit shown in FIG. 9 and includes a further shunt resistor 761 and a regulator 762, 763. The further shunt resistor 761 is connected between the second load node $S1_i$ of the electronic switch $2_i$ and the output node $S2_i$ of the current sensor. The regulator 762, 763 is connected to a circuit node of the shunt resistor 75 facing away from the second load node $S1_i$ and a circuit node of the further shunt resistor 761 facing away from the second load node $S1_i$. The regulator includes an operational amplifier 762 connected to the shunt resistors 75, 761 and a variable resistor 763 controlled by the operational amplifier 762. The variable resistor 763 is connected in series with the further shunt resistor 761 and is operated by the operational amplifier 762 such that a voltage across the further shunt resistor 761 equals the voltage V75 across the shunt resistor 75. According to one example, the variable resistor 763 is a MOSFET, such as a p-type MOSFET. When the voltage across the further shunt resistor 761 equals the voltage V75 across the shunt resistor 75, a current through the further shunt resistor 761 is proportional to the load current $Iz_i$. This current through the further shunt resistor 761 forms the current sense signal $CS_i$ in this example. A proportionality factor between the current sense signal $CS_i$ and the load current $Iz_i$ is dependent on resistances of the shunt resistors 75, 761. According to one example, the shunt resistor 75 and the further shunt resistor 761 include the same type of resistance material so that these resistors have the same type of temperature drift of their respective electric resistance.

According to one example, the current sensors (see $70_1$-$70_n$ in FIG. 8) are implemented such that they have the same proportionality factor (which is often referred to as $k_{ILIS}$ factor) between the load current ($Iz_i$ in FIGS. 9 to 11) of the corresponding electronic switch ($2_i$ in FIGS. 9 to 11) and the sense signal ($CS_i$ in FIGS. 9 to 11) so that the overall current sense signal $CS_{TOT}$ is proportional to the overall load current Iz, wherein the overall load current is given by a sum of the load currents $Iz_i$ through the individual electronic switches $2_i$. According to another example, the current sensors are implemented such that they have different proportionality factors. In this example, the adder 71 shown in FIG. 8 is configured to calculate a weighted sum of the sense signals $CS_1$-$CS_n$ such that the overall current sense signal $CS_{TOT}$ is again proportional to the overall load current Iz.

Figure 12:
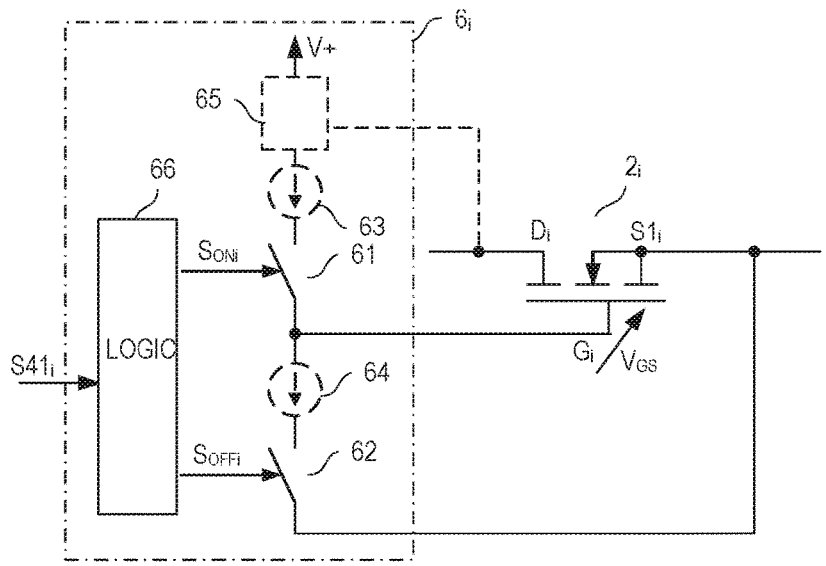
FIG. 12 shows one example of a driver configured to drive one switch circuit.

FIG. 12 shows one example of a driver $6_i$ configured to drive an electronic switch $2_i$. If there is a current sensor $70_i$ of the type shown in FIG. 9, the driver also drives the sense transistor (72 in FIG. 9) of this current sensor. Such current sensor, however, is not shown in FIG. 12. In FIG. 12, reference character $2_i$ represents any of the electronic switches $2_1$-$2_n$ explained above. Reference character $6_i$ represents the associated driver, that is, the driver configured to drive the electronic switch $2_i$ based on the output signal $S41_i$ of the corresponding logic gate ($41_1$-$41_n$ in FIGS. 5 and 6).

Referring to FIG. 12, the driver $6_i$ includes a half-bridge with a low-side switch 62 coupled between the control node $G_i$ and the second load node $S1_i$ of the electronic switch $2_i$ and a high-side switch 61 coupled between the control node $G_i$ and a supply node V+. Optionally, a charge pump circuit 65 is coupled between the supply V+, the first load node $D_i$ of the electronic switch $2_i$ and the high-side switch. The charge pump circuit 65, which may include a bootstrap circuit, may be used in those case in which the electronic circuit is connected in a high-side configuration, as shown in FIGS. 1 and 3. In a high-side configuration, the load path 11-12 of the electronic circuit is connected between the first supply potential $V_{BAT}$ and the load Z.

Referring to FIG. 12, a logic circuit 66 receives the output signal $S41_i$ from the respective logic gate ($41_1$-$41_n$ in FIGS. 4 and 5) and generates a drive signal $S_{ONi}$ for the high-side switch and $S_{OFFi}$ for the low-side switch based on this logic gate output signal $S41_i$. The logic circuit 66 is configured to generate the drive signal $S_{ONi}$ of the high-side switch 61 such that the high-side switch 61 switches on if the logic gate output signal $S41_i$ indicates that it is desired to switch on the electronic switch $2_i$. The drive signal $S_{OFFi}$ of the low-side switch 62 is generated such that the low-side switch 62 switches off when the high-side switch 61 switches on. Equivalently, the logic circuit 66 generates the drive signal $S_{OFFi}$ of the low-side switch 62 such that the low-side switch 62 switches on when the logic gate output signal $S41_i$ indicates that it is desired to switch off the electronic switch $2_i$. The drive signal $S_{ONi}$ of the high-side switch 61 is generated such that the high-side switch 61 switches off when the low-side switch 62 switches on. Switching on the low-side switch 62 is equivalent to setting a gate-source voltage $V_{GS}$ of the MOSFET that forms the electronic switch $2_i$ to zero so that the MOSFET switches off. Switching on the high-side switch 61 is equivalent to adjusting the gate-source voltage $V_{GS}$ to be different from zero and higher than a threshold voltage of the MOSFET, so that the MOSFET $2_i$ switches on.

Optionally, a first current source 64 is connected in series with the low-side switch 62 and a second current source 63 is connected in series with the high-side switch 61. A MOSFET, such as the MOSFET forming the electronic switch $2_i$, includes an internal gate-source capacitance (not shown in the drawings). This gate-source capacitance is charged when the high-side switch 61 switches on and is discharged when the low-side switch 62 switches on. How fast this internal gate-source capacitance is charged and discharged can be adjusted by the optional current sources 63, 64, whereas adjusting a rate at which the internal gate-source capacitance is charged and discharged is equivalent to adjusting a switching speed of the electronic switch $2_i$.

Figure 13:
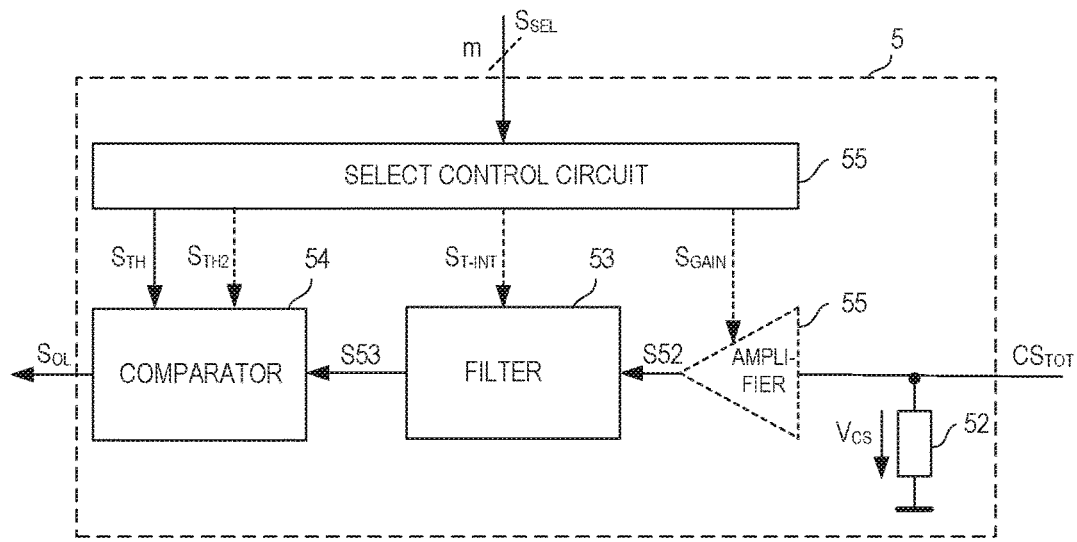
FIG. 13 shows one example of an overload detector that includes a filter and a comparator circuit.

FIG. 13 shows a block diagram of an overload detector 5 according to one example. In this example, the overload detector 5 includes a filter 53 that receives the overall current sense signal $CS_{TOT}$ or a signal dependent on the overall current sense signal $CS_{TOT}$. If, for example, the overall current sense signal $CS_{TOT}$ is a current, for example, as generated by the current sensors $70_1$-$70_n$ explained above, the filter 53 may not receive the current sense signal $CS_{TOT}$ but a voltage $V_{CS}$ that is dependent on this overall current sense signal $CS_{TOT}$. This voltage $V_{CS}$ may be generated by a resistor 52 that receives the current sense signal $CS_{TOT}$. In FIG. 13, reference character S52 denotes a filter input signal. This filter input signal is either the overall current sense signal $CS_{TOT}$ or the voltage $V_{CS}$ generated based on the current sense signal $CS_{TOT}$.

Referring to the above, the overload detector 5 is configured to use one of several protection characteristics for generating the overload signal $S_{OL}$ based on the current sense signal $CS_{TOT}$, wherein the protection characteristic that is used is selected dependent on the select signal $S_{SEL}$. In the overload detector 5 shown in FIG. 13 a select control circuit 55 receives the select signal $S_{SEL}$ and selects the protection characteristic dependent on the select signal $S_{SEL}$. "To select the protection characteristic" in this example means to generate a threshold signal $S_{TH}$ received The filter 53 is configured to filter the input signal S52 and generate a filter output signal S53 based on the filter input signal. A comparator 54 receives the filter output signal S53 and generates the overload signal $S_{OL}$ dependent on the filter output signal S53 and the select signal $S_{SEL}$. Examples of the filter 53 and the comparator 54 are explained in further detail herein below. Referring to the above, the overload detector 5 is configured to use one of several protection characteristics for generating the overload signal $S_{OL}$ based on the current sense signal $CS_{TOT}$, wherein the protection characteristic that is used is selected dependent on the select signal $S_{SEL}$. In the overload detector 5 shown in FIG. 13 a select control circuit 55 receives the select signal $S_{SEL}$ and selects the protection characteristic dependent on the select signal $S_{SEL}$. "To select the protection characteristic" in this example means to generate a threshold signal $S_{TH}$ received by the comparator 54 dependent on the select signal $S_{SEL}$. According to one example, the select and control circuit 55 includes a look-up table that stores a signal level of the threshold signal $S_{TH}$ for each different value the select signal $S_{SEL}$ can have and, based on a value of the select signal outputs the threshold signal $S_{TH}$ with the corresponding signal level.

It should It should be noted that the block diagram shown in FIG. 13 illustrates the functional blocks of the overload detector rather than a specific implementation. Those functional blocks can be implemented in various ways. According to one example, these functional blocks are implemented using dedicated circuitry. According to another example, at least some of these circuit blocks such as the filter 53 and the comparator are implemented using hardware and software. The filter 53 and the comparator 54 may be implemented as analog or digital circuits. In the latter case, input signals received by these circuits and output signals provided by these circuits may be binary words, wherein signal levels of these signals are represented by values of the binary words.

Figure 14:
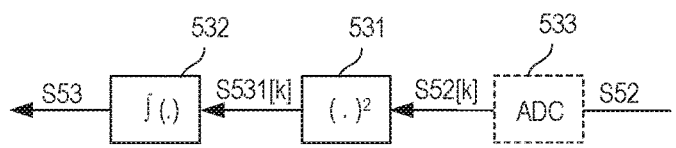
FIG. 14 shows one example of the filter.

FIG. 14 shows one example of the filter 53. In this example, the filter 53 includes a calculation unit 531 that calculates the square of the signal level of the filter input signal S52. An integrator 532 receives the output signal of the calculation unit 531 and generates the filter output signal S53. It should be noted that the calculation unit 531 and the integrator 532 may be analog or digital circuits. If the calculation unit 531 and the integrator 532 are digital circuits, the filter 53 further includes an analog to digital converter (ADC) 533 (illustrated in dashed lines in FIG. 14) that receives the filter input signal S52, samples the filter input signal S52 and outputs a sequence S52[k] of discrete values each representing one sample.

According to one example, the integrator 532 is a window integrator that is configured to integrate an output signal S53 of the calculation circuit in a sliding time window of a predefined duration (in a digital filter 53 the integrator 532 may be implemented as an adder that sums a predefined number of discrete output values of the calculation unit 531). The filter output signal S53, in this example, represents the integral of the square of the filter input signal S52 over the predefined time window. As the filter input signal S52 represents the load current Iz, the filter output signal S53 represents the square of the load current Iz integrated over a predefined time window. In other words, the filter output signal S53 represents the square of the load current Iz multiplied with the time. It is generally known that the electrical energy dissipated in a resistive load, such as a cable, within a certain time window is proportional to the square of the current multiplied with the duration of the time window. Thus, the filter output signal S53 is representative of the electrical energy dissipated in the cable within a predefined time window. The energy dissipated in the cable causes an increase of a temperature of the cable relative to an ambient temperature of the cable. A part of the energy dissipated in the cable is emitted to the environment by radiation so that, after the current through the cable has turned to zero, the temperature of the cable returns to the ambient temperature. In the filter 53 this is taken into account by using a window integrator 532.

The absolute temperature of the cable is given by the ambient temperature of the cable plus a temperature difference caused by the energy dissipated in the cable due to the load current Iz. This absolute temperature should not exceed a maximum temperature in order to protect the cable from being damaged or even destroyed. The maximum temperature that a cable, in particular the insulation, can withstand and the amount of energy that needs to be dissipated in the cable in a certain time period (such as the time period uses by the window integrator) in order to increase the cable temperature by a certain amount is dependent on the type of cable. In a cable with a first diameter, for example, a load current with a first current level may cause the cable temperature to increase by a first amount within a first duration, while a load current with the same level and flowing for the first duration may cause a lower increase of the temperature in a cable with a second diameter larger than the first diameter. Further, a cable with a higher maximum temperature may withstand a certain current for a longer time than a cable with a lower maximum temperature. The latter is equivalent to that the cable with the higher maximum temperature may withstand a higher current for a certain time than the cable with the lower maximum temperature.

Basically, protecting a cable may include determining an absolute temperature of the cable, which is an ambient temperature plus a temperature difference resulting from the energy dissipated in the cable due to a load current, and switching off the load current when the absolute temperature reaches the maximum temperature specified for the cable. The ambient temperature may be measured. A simplified approach to protecting the cable is based on the assumption that the ambient temperature usually does not rise above a maximum ambient temperature and switches off the load current when the temperature difference caused by the load current equals the maximum temperature specified for the cable minus the maximum ambient temperature. This approach is used by the protection circuit 5 shown in FIGS. 13 and 14 where the filter output signal S53 only represents the amount of energy that was dissipated in the cable within a certain time period specified by the window comparator. This energy causes the cable temperature to increase. Which temperature increase a certain cable can withstand and which amount of energy is required to cause such increase is dependent on the specific type of cable and the specific ambient conditions. The electronic circuit is configured to protect different types of cables, wherein the protection characteristic (which may also be referred to as trip characteristic or trip curve) is dependent on the select signal. The protection characteristic of the electronic circuit is defined at least by the comparator circuit 54, which is explained below.

Figure 15:
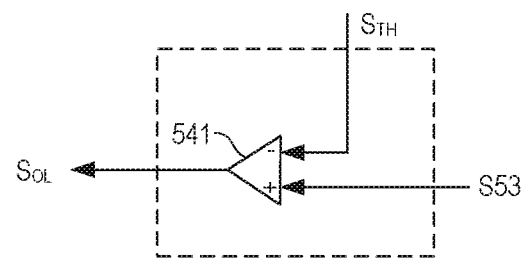
FIG. 15 shows one example of the comparator circuit.

FIG. 15 shows one example of a comparator circuit 54. In this example, the comparator circuit 54 includes a comparator 541 that receives the filter output signal S53 and the threshold signal $S_{TH}$. The overload signal $S_{OL}$ is available at an output of the comparator 541. According to one example, the comparator 541 generates the overload signal $S_{OL}$ such that the overload signal $S_{OL}$ has an overload level if the filter output signal S53 is higher than the threshold signal $S_{TH}$. Referring to the above, the threshold signal $S_{TH}$ is dependent on the select signal $S_{SEL}$ and may be provided by a look-up table included in the select control circuit 55 dependent on the select signal $S_{SEL}$. Referring to the explanation above, the characteristic curves 111, 121 shown in FIG. 4 can be obtained by calculating $Iz^2 \cdot t=c$, wherein c is a constant that is dependent on the specific type of cable. Consequently, the trip curves 110, 120 shown in FIG. 4 can be obtained by calculating $Iz^2 \cdot t=c'$, wherein c' is a constant that is dependent on the specific type of cable to be protected. Referring to the above, the filter output signal S53 represents $Iz^2 \cdot t$. The threshold signal $S_{TH}$, which is dependent on the select signal $S_{SEL}$, represents c' so that the overload signal $S_{OL}$ generated by the comparator circuit 54 is generated in accordance with a trip curve of the type shown in FIG. 4. A plurality of different trip curves are implemented by having different threshold signals $S_{TH}$.

Figure 16:
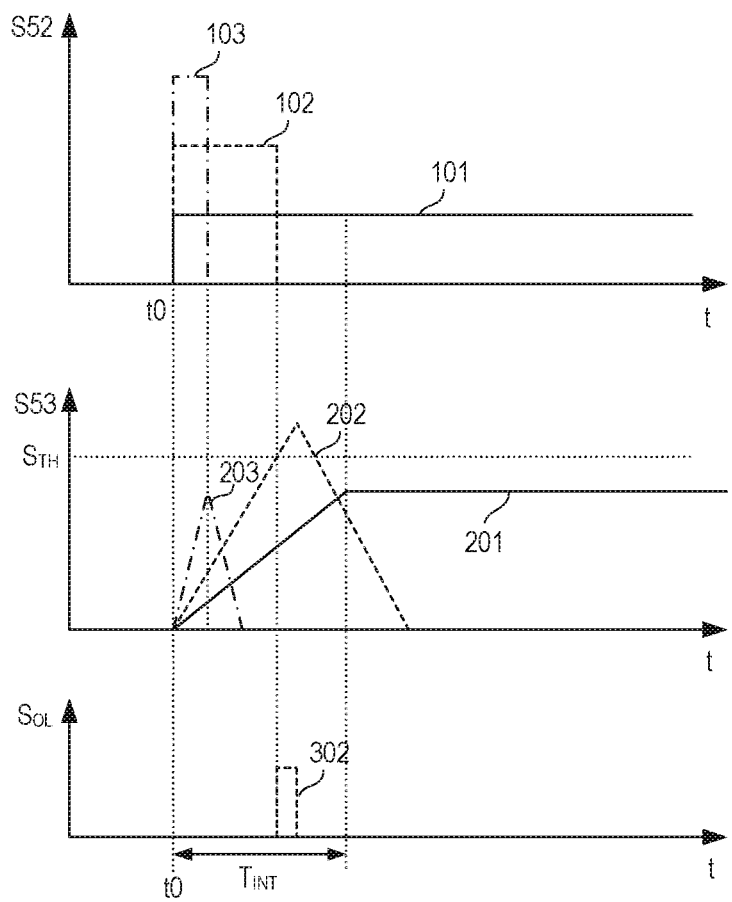
FIG. 16 shows timing diagrams that illustrate the function of the overload detector.

The function of the overload detector 5 shown in FIGS. 13 to 15 is illustrated in FIG. 16 which illustrates timing diagrams of the filter input signal S52, the filter output signal S53 and the overload signal $S_{OL}$ in three different operation scenarios. In each of these scenarios a group of electronic switches $2_1$-$2_n$ is activated (switched on) at a time t0, so that a load current Iz flows, wherein this load current is represented by the filter input signal S52. The three operation scenarios are different in the current level of the load current and, therefore, in the signal level of the filter input signal S52. First curves 101, 201 shown in FIG. 16 illustrate the filter input signal S52 and the corresponding filter output signal S53 according to a first scenario, second curves 102, 202 shown in FIG. 16 illustrate the filter input signal S52 and the corresponding filter output signal S53 according to a second scenario, and third curves 103, 203 shown in FIG. 16 illustrate the filter input signal S52 and the corresponding filter output signal S53 according to a third scenario. In each of these scenarios the same protection characteristic, that is, the same signal level of the threshold signal $S_{TH}$ is used by the overload detector 5. The threshold signal $S_{TH}$ is illustrated by a dotted line in the signal diagram of the filter output signal S53 shown in FIG. 16. According to the first scenario shown in FIG. 16, the filter input signal S52 has a first signal level beginning at time t0. By virtue of the integrating characteristic of the filter, the filter output signal starts to increase beginning at time t0. A rate at which the filter output signal S53 increases is dependent on a signal level of the filter input signal S52. According to one example, the rate is proportional to a square of the signal level of the filter input signal S52. Just for the purpose of illustration, the filter input signal S52 is drawn to have a constant signal level after time t0. Further, it is assumed that the integrator (532 in FIG. 14) is a window integrator. In this case, the filter output signal S53 reaches a maximum after a time period $T_{INT}$ following time t0. This time period essentially equals a duration of a (sliding) time window in which the integrator 532 integrates its input signal S531[k]. In the first scenario, the current level of the load current Iz is such that the filter output signal S53 does not reach the threshold signal $S_{TH}$ so that this load current Iz may flow as long as the group of electronic switches that support this load current are active.

According to the second scenario, the load current Iz and, therefore, the filter input signal 102 is higher so that the filter output signal S53 reaches the threshold signal $S_{TH}$ within the time period $T_{INT}$ following time t0. This causes the overload detector to generate an overload level of the overload signal $S_{OL}$, as shown by curve 302 in FIG. 16. This, in turn, causes the drive circuit to disable the electronic switches, the load current Iz and the filter input signal S52 to decrease to zero. Due to propagation delays in the electronic circuit, the filter output signal may exceed the threshold signal $S_{TH}$ before the electronic switches $2_1$-$2_n$ are disabled.

According to the third scenario, the load current Iz and, therefore, the filter input signal S52 is even higher than in the second scenario. In the third scenario, however, the load current only flows for a time period that is too short for the filter output signal S53 to reach the threshold signal S53 because, for example, the electronic switches $2_1$-$2_n$ are switched off or the current consumption of the load decreases. Thus, the third scenario, the overload signal $S_{OL}$ maintains the non-overload level and the electronic switches are not disabled.

Referring to the above, a change of the filter output signal S53 after time t0 (when the load current starts to increase) represents a change of the cable temperature relative to an ambient temperature. This change of the cable temperature is induced by the load current.

Optionally, and as shown by a dashed line in FIG. 13, the select control circuit 55 not only generates the threshold signal $S_{TH}$ dependent on the select signal $S_{SEL}$, but additionally adjusts the duration $T_{INT}$ of the window period of the window integrator 532 based on the select signal $S_{SEL}$. In this example, a protection characteristic is defined by the threshold signal $S_{TH}$ and a window period signal $S_{T\text{-}INT}$, wherein the window period signal $S_{T\text{-}INT}$ is received by the filter 53 and adjusts the duration $T_{INT}$ of the window period. According to one example, the select control circuit 55 includes a look-up table which stores different levels of the window period signal $S_{T\_INT}$, wherein these different levels are associated with different levels of the select signal $S_{SEL}$, and outputs one of these signal levels based on the select signal $S_{SEL}$.

The filter 53 shown in FIG. 13 may be configured to process an input signal S52 with a certain signal range, wherein the signal range is defined by a minimum signal level such as zero and a maximum signal level that the filter can process. The signal range of the filter input signal S52 is given by the signal range of the current sense signal $CS_{TOT}$, wherein this signal range is, for example, dependent on which of the electronic switches $2_1$-$2_n$ is/are activated. There may be groups of electronic switches that are activated when the load Z has a low power consumption (and the cable has a low current capacity) and other groups of electronic switches that are activated when the load Z has a high power consumption (and the cable has a high current capacity). Optionally, and in order to adapt the signal range of the current sense signal $CS_{TOT}$ to the signal range the filter can process, the overload detector includes an amplifier 55 connected upstream the filter 53 and configured to generate the filter input signal S52 by amplifying the current sense signal $CS_{TOT}$ (or the signal $V_{CS}$). The optional amplifier 55 is a variable gain amplifier, wherein the gain is dependent on a gain signal $S_{GAIN}$ received from the select and control circuit 55. The select and control circuit 55 may be configured to provide the gain signal $S_{GAIN}$ dependent on the select signal $S_{SEL}$ so that each protection characteristic implemented in the overload detector 5 is further defined by a gain of the amplifier 55.

Figure 17:
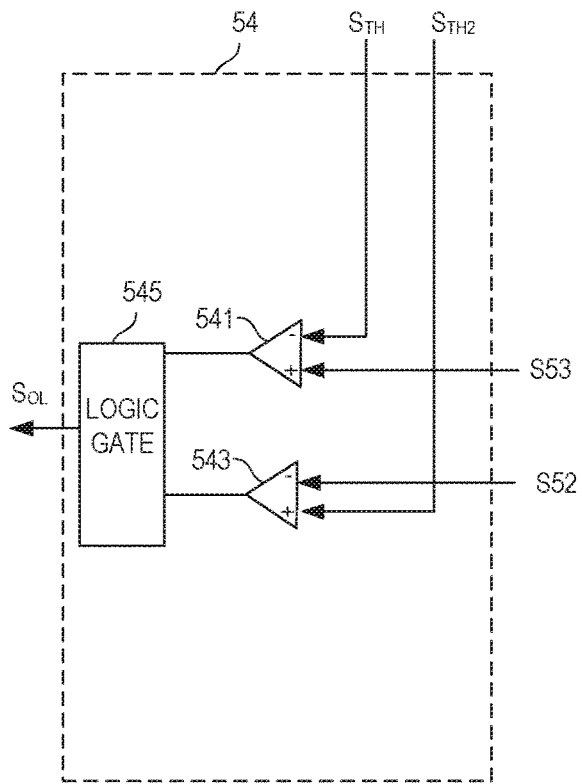
FIGS. 17 to 19 show further examples of the comparator circuit.

FIG. 17 shows a modification of the comparator circuit 54 shown in FIG. 15. In this example, the comparator circuit 54 not only receives the filter output signal S53 but also the filter input signal S52, which represents the load current Iz. This filter input signal S52 is received by another comparator 543. This other comparator 543 further receives a further threshold signal $S_{TH2}$ that represents the maximum load current (see $I_{MAX1}$, $I_{MAX2}$ in FIG. 4) that is allowed to flow through a respective cable. This further threshold signal $S_{TH2}$ may be provided by the select control circuit 55 based on the select signal $S_{SEL}$, as illustrated by a dashed line in FIG. 13. A logic gate 545 receives an output signal S541 from the first comparator 541 and an output signal S543 from the second comparator 543 and generates the overload signal $S_{OL}$ such that the overload signal $S_{OL}$ has an overload level if the output signal S541 of the first comparator 541 indicates that the filter output signal S53 is higher than the further threshold signal $S_{TH2}$ and/or the second comparator 543 indicates that the current sense signal S52 is higher than the maximum signal S544.

Figure 18:
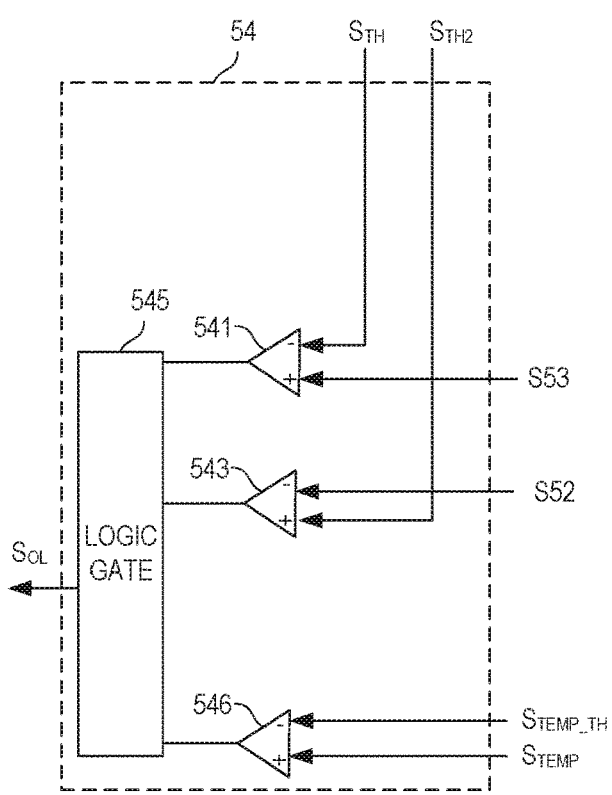

Referring to FIG. 18, the comparator circuit 54, additionally or optionally to the second comparator 543, may include a third comparator 545 that receives a temperature signal $S_{TEMP}$. This temperature signal may be generated by a temperature sensor (not shown in the drawings) and represents a temperature of at least one of the electronic switches $2_1$-$2_n$. According to one example, the temperature signal $S_{TEMP}$ represents a maximum of the temperatures of the individual electronic switches $2_1$-$2_n$. According to one example, these electronic switches are integrated in one semiconductor die. In this example, the temperature signal $S_{TEMP}$ represents the temperature of the semiconductor die or the temperature at the position of each switch. The third comparator 545 compares the temperature signal $S_{TEMP}$ with a temperature threshold signal $S_{TEMP\_TH}$. This temperature threshold signal $S_{TEMP\_TH}$ represents a maximum tolerable temperature of the electronic switches. The logic gate 545 receives an output signal S546 from the third comparator 546 and generates the overload signal $S_{OL}$ dependent on this signal S546 such that the overload signal $S_{OL}$ has an overload level when the comparator output signal S546 indicates that the temperature represented by the temperature signal $S_{TEMP}$ is higher than a temperature threshold represented by signal $S_{TEMP\_TH}$.

Figure 19:
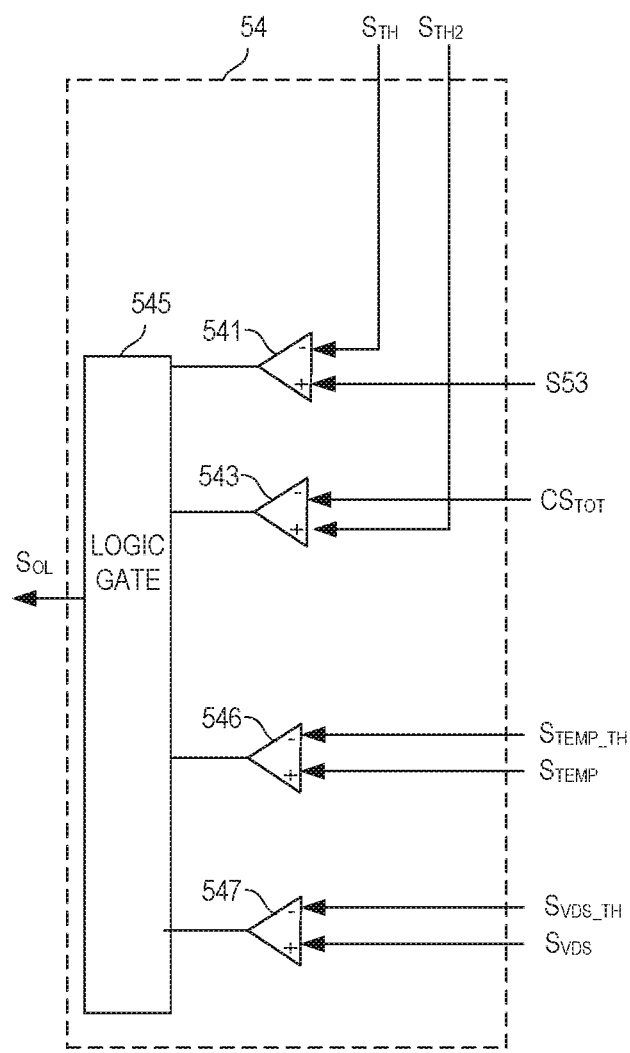

Optionally or additionally to the comparators 543, 546 the comparator circuit 54, referring to FIG. 19, may include another comparator 547 that receives a signal $S_{VDS}$ that represents a voltage across the load path 11-12 of the electronic circuit. The fourth comparator 547 compares this voltage with a threshold signal $S_{VDS\_TH}$. The logic gate 545 receives the output signal from the fourth comparator 547 and generates an overload level of the overload signal $S_{OL}$ if the output signal S547 of the fourth comparator 547 indicates that the load path voltage $V_{DS}$ is higher than a threshold represented by the signal $S_{VDS\_TH}$. The load path voltage of the electronic circuit may be measured by a conventional voltage measurement circuit (not shown in the drawings).

The following examples may illustrate one or more aspects of the disclosure.

Example 1

An electronic circuit, including: a plurality of electronic switches each including a load path and a control node, wherein the load paths are connected in parallel between a first load node and a second load node of the electronic circuit; a current sense circuit configured to sense a load current between the first load node and the second load node and to generate a current sense signal representing the load current; a drive circuit configured to drive the plurality of electronic switches based on at least one input signal; and an overload detector. The overload detector is configured to receive the current sense signal and a select information, and generate an overload signal dependent on the current sense signal and the select information.

Example 2

The electronic circuit of example 1, wherein the drive circuit is configured to receive the overload signal and disable the plurality of electronic switches when the overload signal indicates that an overload scenario has been detected.

Example 3

The electronic circuit of any combination of examples 1-2, wherein the overload detector includes: a filter configured to generate a filter output signal based on filtering a filter input signal; and a comparator circuit configured to compare the filter output signal with a threshold signal and generate the overload signal based on the comparison, wherein the filter input signal is dependent on the load current signal, and wherein the threshold signal is dependent on the select information.

Example 4

The electronic circuit of example 3, wherein the filter includes an integrator configured to integrate an integrator input signal that is dependent on the filter input signal.

Example 5

The electronic circuit of example 4, wherein the integrator input signal is dependent on a square of the filter input signal.

Example 6

The electronic circuit of any combination of examples 4-5, wherein the integrator is a window integrator configured to integrate the integrator input signal over a time window.

Example 7

The electronic circuit of example 6, wherein a duration of the time window is dependent on the select information.

Example 8

The electronic circuit of any combination of examples 3-7, wherein the overload detector further includes: a variable gain amplifier configured to receive the current sense signal and generate the filter input signal by amplifying the current sense signal, wherein a gain of the variable gain amplifier is dependent on the select information.

Example 9

The electronic circuit of any combination of examples 1-8, wherein the plurality of electronic switches have essentially the same on-resistance.

Example 10

The electronic circuit of any combination of examples 1-9, wherein at least two of the electronic switches have different on-resistances.

Example 11

The electronic circuit of any combination of examples 1-10, wherein the drive circuit is configured to receive a plurality of input signals, wherein each of these input signals is associated with a corresponding one of the electronic switches, and wherein the drive circuit is configured to drive each of the plurality of switches based on the corresponding input signal.

Example 12

The electronic circuit of example 1, further including: a select signal generator configured to receive the plurality of input signals and generate at least a part of the select information based on the plurality of input signals.

Example 13

The electronic circuit of any combination of examples 1-12, wherein the current sense circuit includes: a plurality of current sensors, wherein each of the plurality of current sensors is configured to sense a current through a corresponding one of the plurality of electronic switches and generate a switch current sense signal, and an adder configured to receive the switch current sense signal from each of the plurality of current sensors and generate the current sense signal based on the received switch current sense signals.

Example 14

The electronic circuit of example 13, wherein each of the plurality of electronic switches includes a load transistor, and wherein each of the current sensors includes a sense transistor coupled with the load transistor of the corresponding electronic switch.

Example 15

The electronic circuit of example 13, wherein each of the current sensors includes a shunt resistor.

Example 16

A method, including: driving a plurality of electronic switches based on at least one input signal, wherein each of the plurality of electronic switches includes a load path and a control node, and wherein the load paths are connected in parallel between a first load node and a second load node of the electronic circuit; generating a current sense signal based on sensing a load current between the first load node and the second load node; and generating an overload signal dependent on the current sense signal and a select information.

Example 17

The method of example 16, further including: disabling the plurality of electronic switches when the overload signal indicates that an overload scenario has been detected.

Example 18

The method of any combination of examples 16-17, wherein generating the overload signal includes: generating a filter output signal based on filtering a filter input signal, wherein the filter input signal is dependent on the load current signal, and comparing the filter output signal with a threshold signal and generating the overload signal based on the comparison, wherein the threshold signal is dependent on the select information.

Example 19

The method of example 18, wherein generating the filter output signal includes integrating an integrator input signal that is dependent on the filter input signal.

Example 20

The method of example 19, wherein the integrator input signal is dependent on a square of the filter input signal.

Example 21

The method of any combination of examples 19-20, wherein the integrating includes integrating the integrator input signal over a time window.

Example 22

The method of example 21, wherein a duration of the time window is dependent on the select information.

Example 23

The method of any combination of examples 18-22, wherein generating the overload signal further includes: generating the filter input signal by amplifying the current sense signal using a variable gain amplifier, wherein a gain of the variable gain amplifier is dependent on the select information.

Example 24

The method of any combination of examples 16-23, wherein the plurality of electronic switches have essentially the same on-resistance.

Example 25

The method of any combination of examples 16-24, wherein at least two of the electronic switches have different on-resistances.

Example 26

The method of any combination of examples 16-25, wherein the at least one input signal includes a plurality of input signals, wherein each of these input signals is associated with a corresponding one of the electronic switches, and wherein driving the plurality of switches includes driving each of the plurality of electronic switches based on the corresponding input signal.

Example 27

The method of any combination of examples 16-26, further including: generating at least a part of the select information based on the plurality of input signals.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second" and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. An electronic circuit comprising:
   a plurality of electronic switches each comprising a load path and a control node, wherein the load paths are connected in parallel between a first load node and a second load node of the electronic circuit;
   a current sense circuit configured to sense a load current between the first load node and the second load node and to generate a current sense signal representing the load current;
   a drive circuit configured to drive the plurality of electronic switches based on at least one input signal; and
   an overload detector comprising:
      a filter configured to generate a filter output signal based on filtering a filter input signal, wherein the filter input signal is dependent on the load current, and wherein the filter comprises an integrator configured to integrate an integrator input signal that is dependent on the filter input signal; and
      a comparator circuit configured to compare the filter output signal with a threshold signal and generate an overload signal based on the comparison,
   wherein the overload detector is configured to:
      receive the current sense signal and a select information, wherein the threshold signal is dependent on the select information; and
      generate the overload signal dependent on the current sense signal and the select information.

2. The electronic circuit of claim 1, wherein the drive circuit is configured to receive the overload signal and disable the plurality of electronic switches when the overload signal indicates that an overload scenario has been detected.

3. The electronic circuit of claim 1, wherein the integrator input signal is dependent on a square of the filter input signal.

4. The electronic circuit of claim 1, wherein the integrator is a window integrator configured to integrate the integrator input signal over a time window.

5. The electronic circuit of claim 4, wherein a duration of the time window is dependent on the select information.

6. The electronic circuit of claim 1,
   wherein the overload detector further comprises a variable gain amplifier configured to receive the current sense signal and generate the filter input signal by amplifying the current sense signal, and
   wherein a gain of the variable gain amplifier is dependent on the select information.

7. The electronic circuit of claim 1, wherein the plurality of electronic switches have essentially the same on-resistance.

8. The electronic circuit of claim 1, wherein at least two of the electronic switches have different on-resistances.

9. The electronic circuit of claim 1,
   wherein the drive circuit is configured to receive a plurality of input signals,
   wherein each of these input signals is associated with a corresponding one of the electronic switches, and wherein the drive circuit is configured to drive each of the plurality of switches based on the corresponding input signal.

10. The electronic circuit of claim 9, further comprising a select signal generator configured to receive the plurality of input signals and generate at least a part of the select information based on the plurality of input signals.

11. The electronic circuit of claim 1, wherein the current sense circuit comprises:
   a plurality of current sensors, wherein each of the plurality of current sensors is configured to sense a current through a corresponding one of the plurality of electronic switches and generate a switch current sense signal, and
   an adder configured to receive the switch current sense signal from each of the plurality of current sensors and generate the current sense signal based on the received switch current sense signals.

12. The electronic circuit of claim 11,
   wherein each of the plurality of electronic switches comprises a load transistor, and
   wherein each of the current sensors comprises a sense transistor coupled with the load transistor of the corresponding electronic switch.

13. The electronic circuit of claim 11, wherein each of the current sensors comprises a shunt resistor.

14. A method comprising:
   driving a plurality of electronic switches based on at least one input signal, wherein each of the plurality of electronic switches comprises a load path and a control node, and wherein the load paths are connected in parallel between a first load node and a second load node of the electronic circuit;
   generating a current sense signal based on sensing a load current between the first load node and the second load node; and
   generating an overload signal dependent on the current sense signal and a select information, wherein generating the overload signal comprises:
   generating a filter output signal based on filtering a filter input signal, wherein the filter input signal is dependent on the load current, and wherein generating the filter output signal comprises integrating an integrator input signal that is dependent on the filter input signal; and
   comparing the filter output signal with a threshold signal and generating the overload signal based on the comparison, wherein the threshold signal is dependent on the select information.

15. The method of claim 14, further comprising disabling the plurality of electronic switches when the overload signal indicates that an overload scenario has been detected.

16. The method of claim 14, wherein the integrator input signal is dependent on a square of the filter input signal.

17. The method of claim 14, wherein the integrating comprises integrating the integrator input signal over a time window.

18. The method of claim 17, wherein a duration of the time window is dependent on the select information.

19. The method of claim 14, wherein generating the overload signal further comprises:
   generating the filter input signal by amplifying the current sense signal using a variable gain amplifier,
   wherein a gain of the variable gain amplifier is dependent on the select information.

20. The method of claim 14, wherein the plurality of electronic switches have essentially the same on-resistance.

21. The method of claim 14, wherein at least two of the electronic switches have different on-resistances.

22. The method of claim 14,
   wherein the at least one input signal comprises a plurality of input signals,
   wherein each of these input signals is associated with a corresponding one of the electronic switches, and
   wherein driving the plurality of switches comprises driving each of the plurality of electronic switches based on the corresponding input signal.

23. The method of claim 22, further comprising generating at least a part of the select information based on the plurality of input signals.

24. An electronic circuit comprising:
   a plurality of electronic switches each comprising a load path and a control node, wherein the load paths are connected in parallel between a first load node and a second load node of the electronic circuit;
   a current sense circuit configured to sense a load current between the first load node and the second load node and to generate a current sense signal representing the load current, wherein the current sense circuit comprises:
      a plurality of current sensors, wherein each of the plurality of current sensors is configured to sense a current through a corresponding one of the plurality of electronic switches and generate a switch current sense signal; and
      an adder configured to receive the switch current sense signal from each of the plurality of current sensors and generate the current sense signal based on the received switch current sense signals;
   a drive circuit configured to drive the plurality of electronic switches based on at least one input signal; and
   an overload detector configured to:
      receive the current sense signal and a select information; and
      generate an overload signal dependent on the current sense signal and the select information.

25. The electronic circuit of claim 24,
   wherein each of the plurality of electronic switches comprises a load transistor, and
   wherein each of the current sensors comprises a sense transistor coupled with the load transistor of the corresponding electronic switch.

26. The electronic circuit of claim 24, wherein each of the current sensors comprises a shunt resistor.

27. The electronic circuit of claim 24,
   wherein the overload detector further comprises a variable gain amplifier configured to receive the current sense signal and generate the filter input signal by amplifying the current sense signal, and
   wherein a gain of the variable gain amplifier is dependent on the select information.

* * * * *